United States Patent
Johnson et al.

(10) Patent No.: US 6,255,583 B1
(45) Date of Patent: Jul. 3, 2001

(54) COVER FOR STANDALONE CHASSIS

(75) Inventors: Kristianne E. Johnson, Fort Collins; Nichole M. Rottinghaus, Greeley, both of CO (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/291,026

(22) Filed: Apr. 13, 1999

(51) Int. Cl.⁷ ...................................................... H05K 9/00
(52) U.S. Cl. ...................... 174/35 R; 361/799; 361/800; 361/683; 361/752; 361/796
(58) Field of Search ........................... 174/35 R; 361/679, 361/683, 725, 752, 796, 816, 818, 799, 800

(56) References Cited

U.S. PATENT DOCUMENTS

| | | | |
|---|---|---|---|
| 5,045,971 | * | 9/1991 | Ono et al. .............................. 361/386 |
| 5,278,351 | * | 1/1994 | Herrick ................................ 174/35 R |
| 5,369,549 | * | 11/1994 | Kopp et al. ............................ 361/679 |
| 5,392,192 | * | 2/1995 | Dunn et al. ............................ 361/683 |
| 5,729,441 | * | 3/1998 | Murakami ............................. 361/818 |
| 5,808,237 | * | 9/1998 | Hancock ............................. 174/35 R |
| 5,844,772 | * | 12/1998 | Lee et al. .............................. 361/683 |
| 5,999,416 | * | 12/1999 | McAnally et al. .................... 361/816 |

* cited by examiner

*Primary Examiner*—Dean A. Reichard
*Assistant Examiner*—Carmelo Oliva

(57) ABSTRACT

A cover for a standalone chassis may comprise a plurality of feet attached to the standalone chassis and an enclosure attached to the plurality of feet to cover a portion of the standalone chassis. The feet extend below a bottom surface of the standalone chassis to provide vertical support for the standalone chassis.

19 Claims, 4 Drawing Sheets

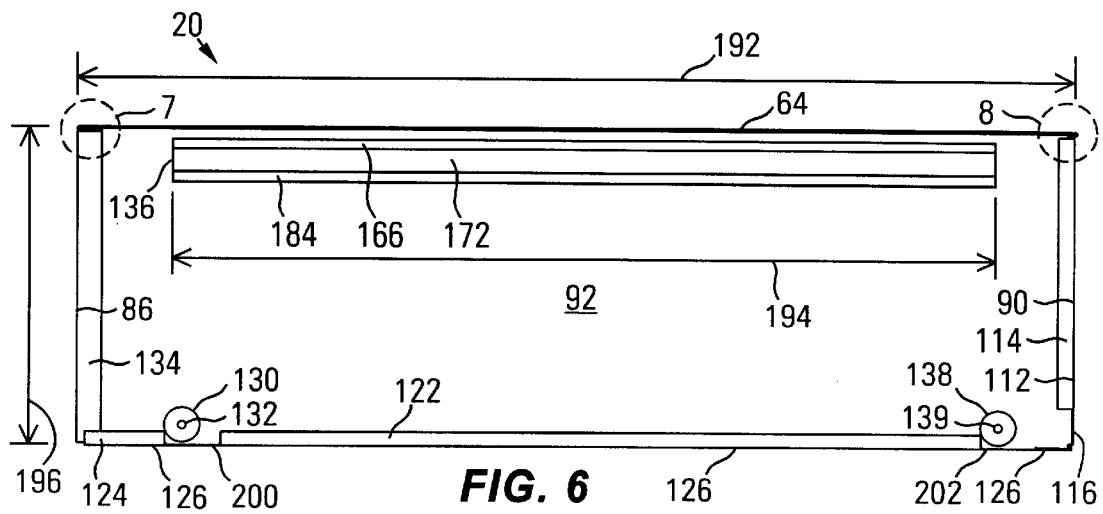
FIG. 6
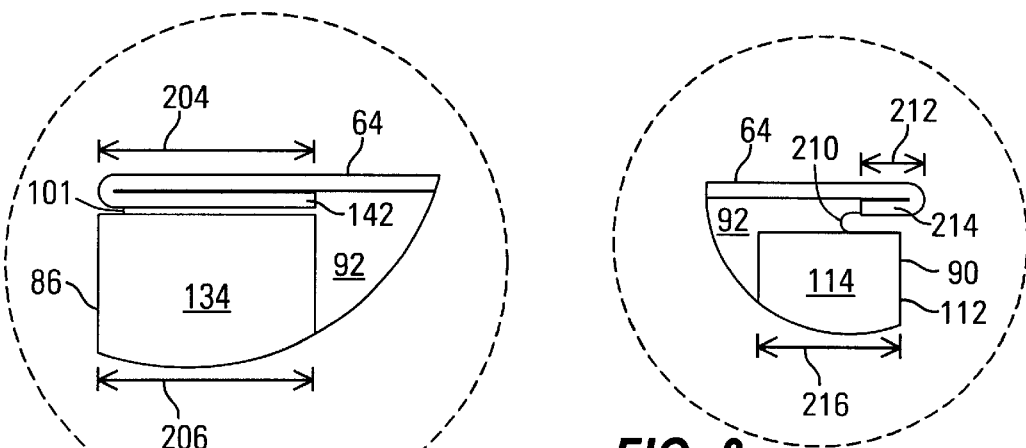
FIG. 7
FIG. 8
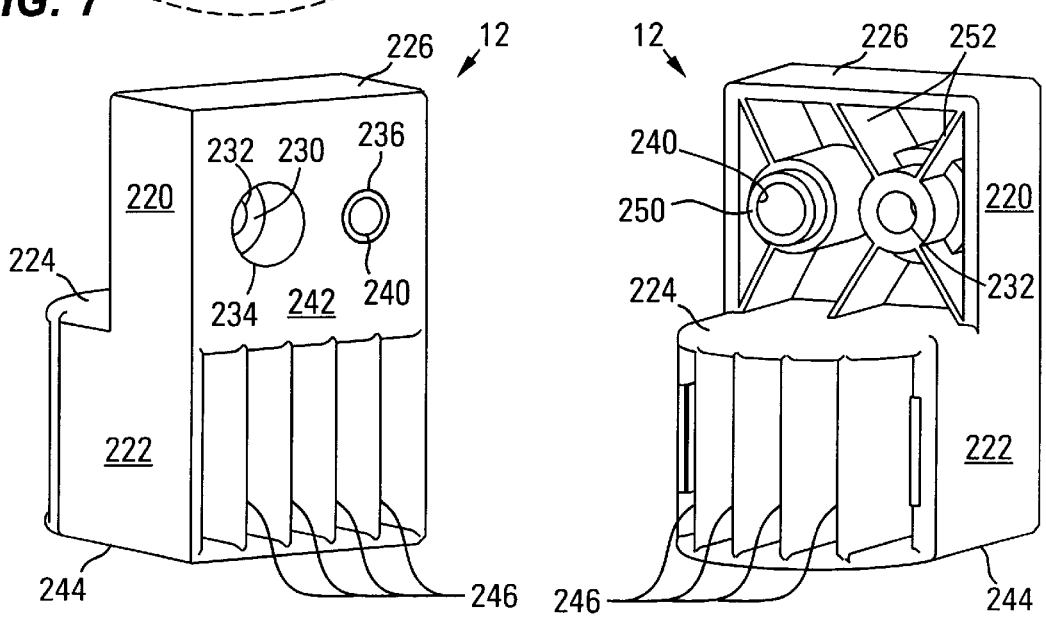
FIG. 9
FIG. 10

COVER FOR STANDALONE CHASSIS

FIELD OF THE INVENTION

This invention relates to chassis covers in general and more specifically to a cover having spacers to adapt to an irregularly shaped chassis.

BACKGROUND

Many types of equipment are housed in a chassis, such as computer equipment or other electrical equipment. Frequently a chassis for electrical equipment consists of a base to support electrical circuit boards and other components, with a rigid open framework extending up from the base. The open framework allows convenient access to the electrical components inside, but does not provide a finished appearance or protection of delicate components mounted in the chassis. Exterior panels or other methods of covering the chassis are often required to protect the contents from physical damage and to provide a finished appearance for a consumer or other user.

Furthermore, if the chassis houses electrical equipment, a cover is required to protect users from electrical shock, as bare electrical conductors are nearly always exposed inside electrical equipment. Preferably, a cover for electrical equipment is grounded to increase protection against accidental electrical shock. Electrical equipment can also be sensitive to dust, requiring a cover to reduce the amount of dust reaching the interior of the chassis.

Electrical equipment is often sensitive to radio-frequency (RF) interference, electromagnetic radiation in the various radio frequencies which can disrupt normal electrical operation. A cover for an electrical chassis, if properly designed, shields the chassis from externally generated RF interference. The cover also prevents electromagnetic interference (EMI), electromagnetic radiation generated by the electrical equipment, from leaving the chassis and interfering with nearby equipment. For example, an unshielded chassis housing electrical equipment can cause EMI which would interfere with television and radio reception near the chassis, and with any other systems using radio communication like baby monitors, wireless radio computer networks, or citizens band radios.

A cover also aids in cooling electrical systems. Electrical equipment housed in a chassis must often be cooled by electric fans mounted in the chassis to circulate air over the heat-generating electrical components, cooling them by convection. However, electrical fans are not as effective at cooling electrical components when blowing in large air spaces. A cover can provide a small area through which air is forced, concentrating air flow over the components.

Irregularly shaped chassis can be difficult to cover, requiring multiple panels or mounting brackets, complicating EMI, grounding, and cooling issues, and reducing esthetic appeal. For example, electrical chassis are frequently designed to be mounted in an electrical rack capable of housing multiple chassis. Such rack mount electrical chassis are not designed to be covered simply, since the design considerations for rack mounting and standalone use often conflict. Equipment with a rack mount chassis is often used as a standalone device, but designing and manufacturing two types of chassis can be cost prohibitive. For example, mass storage devices for computers, like autochanger systems, may be used most frequently in a rack to increase storage capacity, but may also be used as a standalone storage device.

A rack mount chassis may have channels in its sides to accept rollers in the racks, allowing the chassis to be retracted from the rack like a drawer. Such rack mounting features like channels present an irregular structure which is difficult to cover. A rack mount chassis also frequently has an oversized face or bezel designed to overlap the edges of the rack and meet with the bezels of the chassis directly above and below. To cover a chassis having an oversized bezel, the chassis must be elevated to prevent damaging the bottom of the bezel, and the chassis must be adapted to meet the top and side edges of the bezel which extend beyond the chassis.

Consequently, a need exists for a cover for a standalone chassis which is adapted to irregular chassis shapes and which is simple and easy to attach, having a small number of components, while providing for EMI and electrical shock protection and being esthetically pleasing. A need further exists for a cover which provides vertical support to a chassis to protect oversized bezels.

SUMMARY

To assist in achieving the aforementioned needs, the inventors have devised a cover for a standalone chassis, providing for an irregularly shaped chassis, simple assembly and EMI shielding, which provides vertical support to the chassis and protects an oversized bezel.

A cover for a standalone chassis having features of the present invention may comprise a plurality of feet attached to the standalone chassis and an enclosure attached to the plurality of feet to cover a portion of the standalone chassis. The feet extend below a bottom surface of the standalone chassis to provide vertical support for the standalone chassis. The feet may comprise a base portion and a body portion, with the body portion attached to a side of the standalone chassis and the base portion extending below the bottom surface of the standalone chassis to provide vertical support for the standalone chassis.

The invention may also comprise a method for covering a standalone chassis including providing a plurality of feet each comprising a base portion and a body portion and providing an enclosure comprising a top portion and at least two side portions. The body portions of the plurality of feet are attached to at least two side portions of the standalone chassis so that the base portions extend below a lower surface of the standalone chassis to provide vertical support to the standalone chassis. The at least two side portions of said enclosure are attached to the plurality of feet so that the top portion of the enclosure substantially covers a top of the standalone chassis and the at least two side portions of the enclosure substantially cover the at least two chassis side portions.

The invention may also comprise a kit for covering a standalone chassis, including four feet and an enclosure. The four feet each comprising a body portion and a base portion in an 'L' shape. The body portion has a threaded enclosure mounting hole and a chassis mounting hole so that the body portions of the four feet may be screwed to the sides of a standalone chassis through the chassis mounting hole. The base portions extend below a bottom surface of the standalone chassis. The enclosure has a top portion and two side portions, the two side portions each having two embossed mounting holes to enable the enclosure to be screwed to the threaded enclosure mounting holes of the four feet.

BRIEF DESCRIPTION OF THE DRAWINGS

Illustrative and presently preferred embodiments of the invention are shown in the accompanying drawing, in which:

FIG. 6 is a cross-sectional side view of the enclosure of FIG. 4 taken along line 140;

FIG. 7 is a partial view of the enclosure of FIG. 6 showing details of the front top edge;

FIG. 8 is a partial view of the enclosure of FIG. 6 showing details of the rear top edge;

FIG. 9 is a perspective front view of a foot;

FIG. 10 is a perspective rear view of the foot of FIG. 9;

DESCRIPTION OF THE PREFERRED EMBODIMENT

A chassis may be covered to provide protection to the contents of the chassis and to provide an esthetically pleasing package. A cover may also be needed for an electrical chassis to provide for proper cooling airflow over electrical components. Radio-frequency interference (RFI) or electromagnetic interference (EMI) may be shielded by a properly grounded metal cover, and users may be protected from electrical shock by a grounded metal cover.

An irregularly shaped or configured chassis 22 can be difficult to cover. For example, a chassis 22 may be designed for rack mounting with mounting features which would complicate attachment of a cover. Rack mounting features typically include oversized bezels 40 attached to the front of the chassis, or roller channels 48 formed in the sides of the chassis to allow the chassis to be pulled out of the rack like a drawer. A cover allowing a rack mounted chassis to be used as a standalone unit provides a cost effective way to use a single chassis design for both rack mount and standalone chassis.

Figure 1:
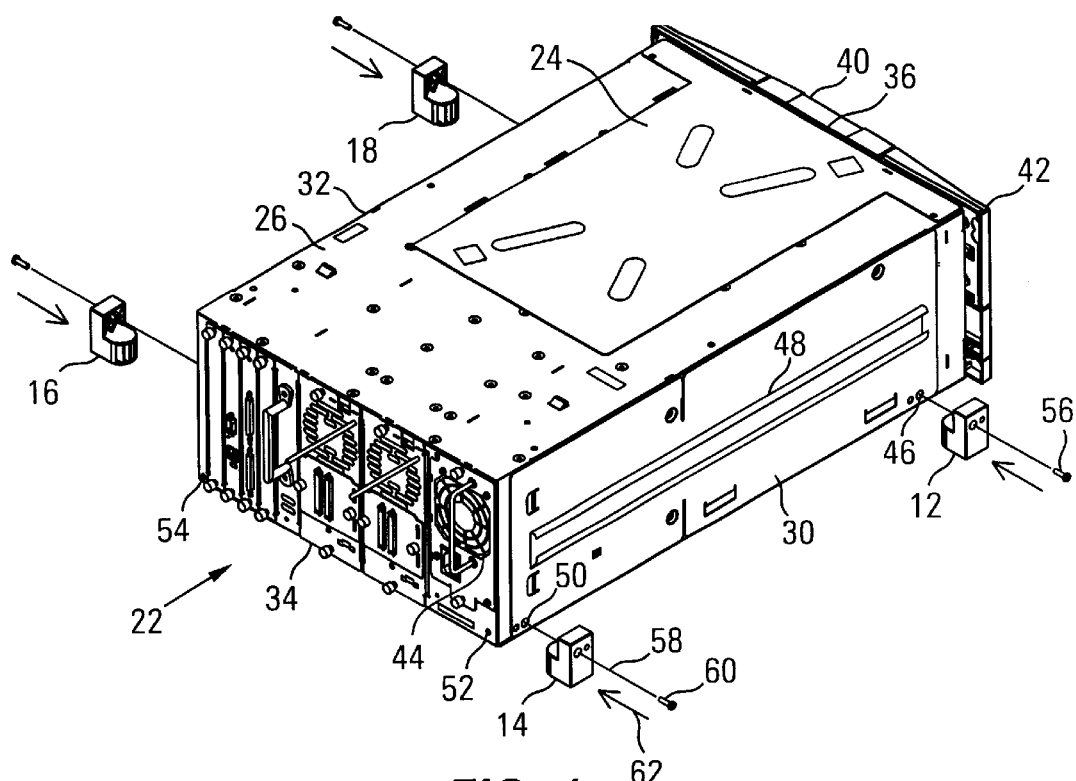
FIG. 1 is an exploded perspective view of a chassis having an oversized bezel illustrating attachment of the feet.
Figure 2:
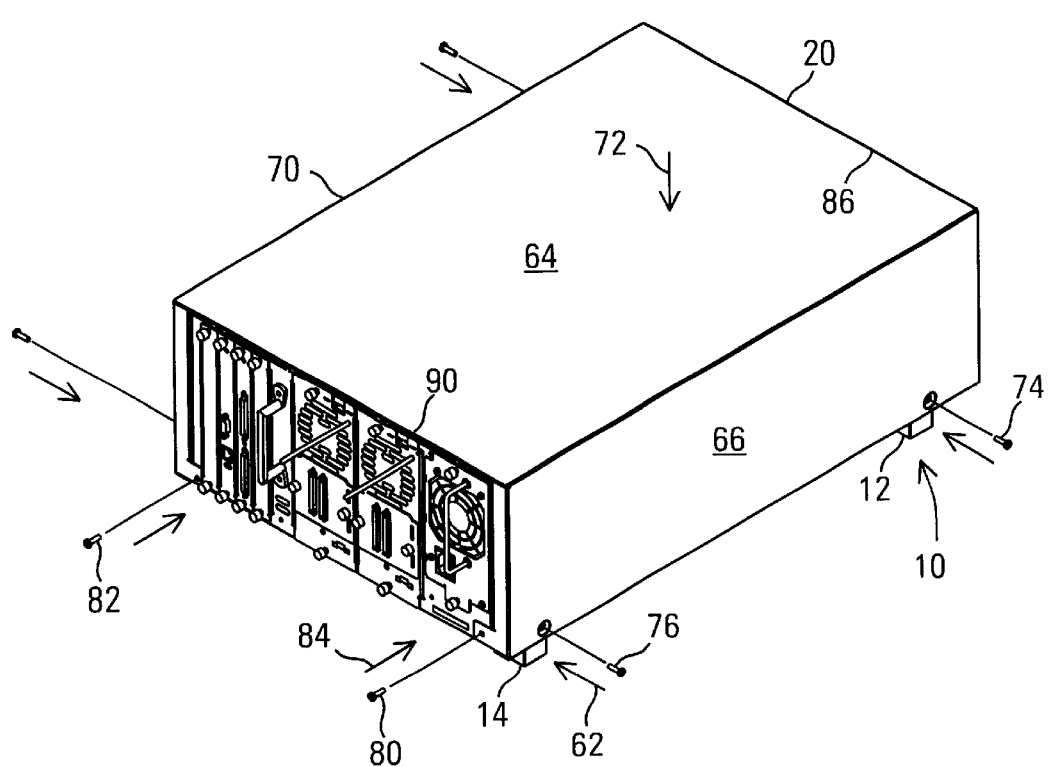
FIG. 2 is an exploded perspective view of a chassis having an oversized bezel illustrating attachment of the enclosure.

A cover 10 for a standalone chassis, as illustrated in FIGS. 1 and 2, may be easily attached to a chassis 22, such as a chassis 22 for storing and accessing computer readable media. The chassis 22 is designed primarily for rack mounting, although the standalone chassis cover 10 allows it to be used as a standalone unit.

A preferred embodiment of the standalone chassis cover 10 may comprise an enclosure 20 and a plurality of feet 12, 14, 16, and 18. The feet 12, 14, 16, and 18 may first be attached to the sides 30 and 32 of the chassis 22 with a plurality of foot mounting screws (e.g., 56 and 60), one screw per foot. The feet 12, 14, 16, and 18 may be attached to the chassis 22 from the sides 30 and 32 along a horizontal path (e.g., 62), greatly simplifying assembly. In contrast, independent feet would typically be mounted to the underside of the chassis 22, requiring that the chassis 22 be turned over to allow access to the underside. The foot mounting screws (e.g., 56 and 60) are screwed through the feet 12, 14, 16, and 18 along screw insertion axes (e.g., 58) in a direction (e.g., 62) towards the sides 30 and 32 of the chassis 22. The foot mounting screws (e.g., 56 and 60) engage in threaded screwholes (e.g., 46 and 50) or nuts in the chassis 22 to hold the feet 12, 14, 16, and 18 against the sides 30 and 32.

The enclosure 20, comprising a top 64, a left side 66 and a right side 70, may then be lowered over the chassis 22 in a substantially vertical direction 72, with the enclosure front 86 adjacent to the chassis front 36 and the enclosure rear 90 adjacent to the chassis rear 34. The enclosure 20 partially covers the feet 12, 14, 16, and 18, leaving exposed portions of the feet 12, 14, 16, and 18 which extend below the chassis 22 to provide vertical support, thereby elevating the chassis 22.

The enclosure 20 may then be attached to the chassis 22 with a plurality of chassis mounting screws (e.g., 74, 76, 80, and 82). Chassis mounting screws (e.g, 74 and 76) are screwed through the sides 66 and 70 of the enclosure 20 into the feet 12, 14, 16, and 18 to secure the enclosure 20 to the feet 12, 14, 16, and 18. Portions of the enclosure 20 may also extend over the rear 34 of the chassis 22 to provide additional support and protection. Chassis mounting screws 80 and 82 may be screwed through the enclosure 20 into threaded screwholes 52 and 54 in the rear 34 of the chassis 22 along direction 84.

A bezel 40, having an overhang 42 extending beyond the sides 30 and 32 of the chassis 22, is covered by the enclosure 20 to provide protection. The standalone chassis cover 10 also provides the chassis 22 with an esthetically pleasing finish and covers holes in the chassis 22. For example, the top 26 of the chassis 22 has a removable panel 24, allowing multiple chassis stacked in a vertical rack to be interconnected. The removable panels (e.g., 24) also provide access to the contents of the chassis 22. These panels (e.g., 24) and other openings in the chassis 22 are covered and hidden by the standalone chassis cover 10 to enable individual use of the chassis as a standalone unit. Other irregular features of the chassis 22 such as roller channels (e.g., 48) are also covered by the standalone chassis cover 10, due to the configuration and side-mounting of the feet 12, 14, 16, and 18 which provides a gap between the chassis 22 and the enclosure 20.

The standalone chassis cover 10 also provides the benefit of improving airflow through the chassis 22, allowing cooling air to travel between a fan 44 at the rear 34 of the chassis 22 and openings (not shown) at the front 36 of the chassis 22. This prevents the cooling air from escaping through multiple holes in the sides 20 and 32 and top 26 of the chassis 22, which would reduce airflow over the contents of the chassis 22.

The standalone chassis cover 10 may also protect the contents of the chassis 22 from RFI or EMI. A preferred embodiment of the enclosure 20 is formed of 18 gauge electro-galvanized steel sheet metal, which is electrically connected to the chassis 22 by the rear enclosure mounting screws 82 and 84 and other contact surfaces to be described hereinafter. The chassis 22 is thereby surrounded by a grounded shield, reducing RFI or EMI and protecting users from electrical shock.

Having briefly described the standalone chassis cover 10 and its use with a chassis 22, as well as some of its more significant features and advantages, an exemplary embodiment of the standalone chassis cover 10 will now be described in detail. However, before proceeding with the detailed description it should be noted that while a presently preferred embodiment is shown and described herein as it could be used with a chassis 22 designed primarily for rack mounting, the standalone chassis cover 10 is not limited to use with any particular type or style of chassis or frame. For example, the standalone chassis cover 10 could also be used to cover a non-electrical chassis. It is important to note that the particular configuration and dimensions of the enclosure 20 and feet 12, 14, 16, and 18 are dependent on the chassis design and the requirements of the manufacturer. Accordingly, the standalone chassis cover 10 according to the present invention should not be regarded as limited to the particular configuration and dimensions shown and described herein.

With the foregoing considerations in mind, one embodiment of the standalone chassis cover 10 is shown and described herein as it could be used with a computer readable media storage chassis 22 designed for rack mounting.

Figure 3:
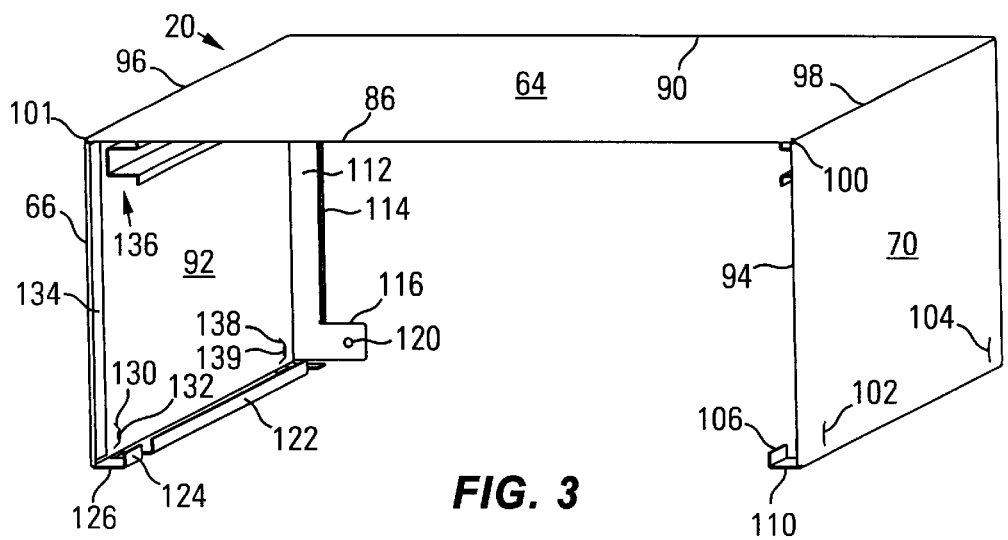
FIG. 3 is a perspective view of an enclosure.
Figure 4:
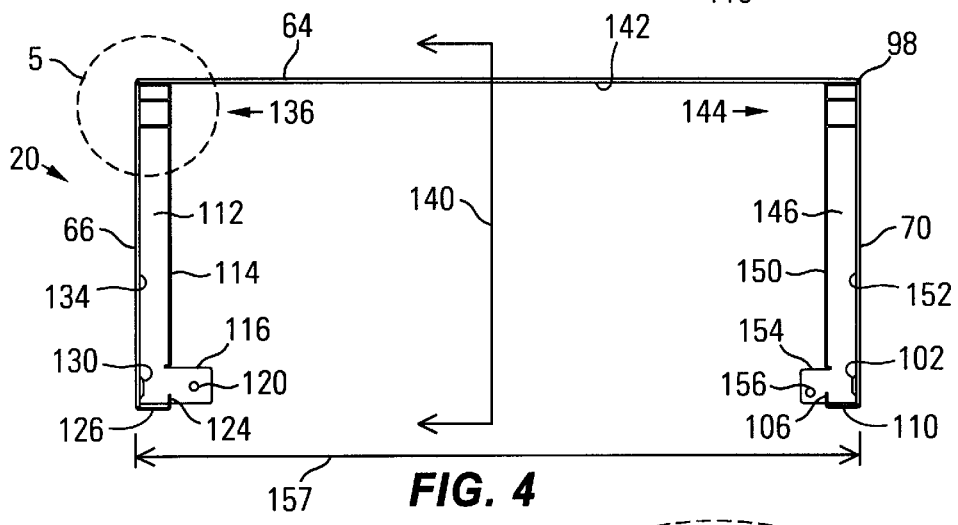
FIG. 4 is a front view of the enclosure of FIG. 3.
Figure 5:
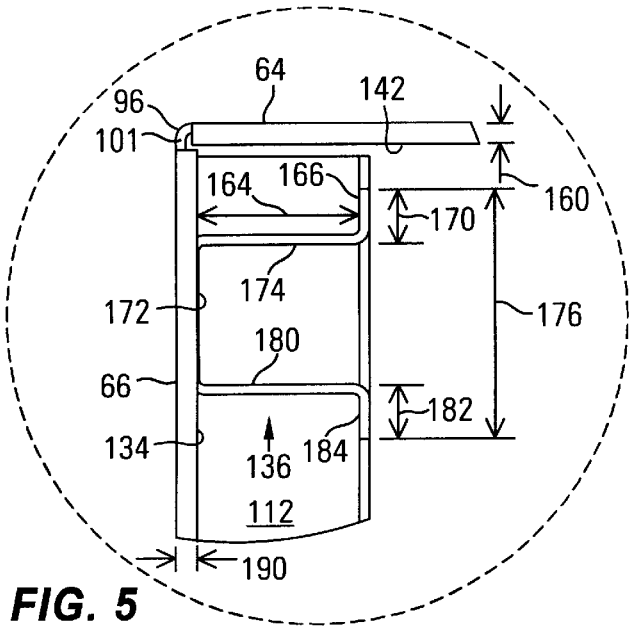
FIG. 5 is a partial view of the enclosure of FIG. 4 showing details of a spacer and a fold between a side and a top of the enclosure.
Figure 11:
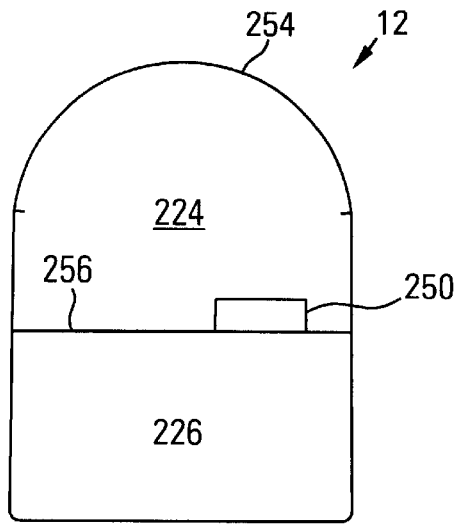
FIG. 11 is a top view of the foot of FIG. 9.
Figure 12:
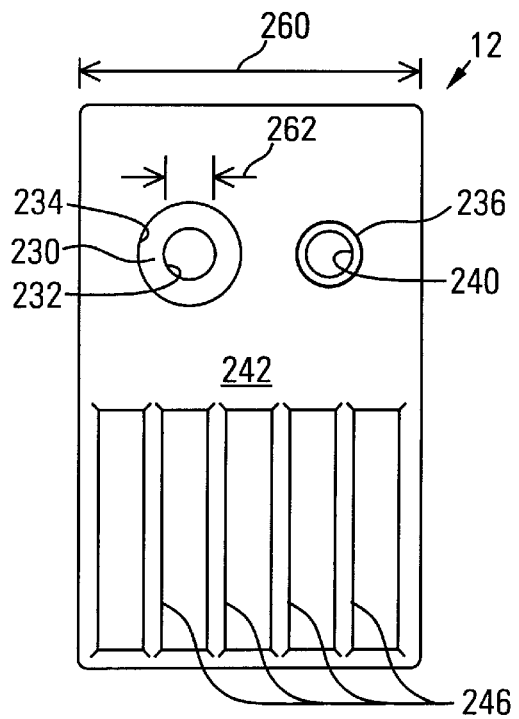
FIG. 12 is a front view of the foot of FIG. 9.
Figure 13:
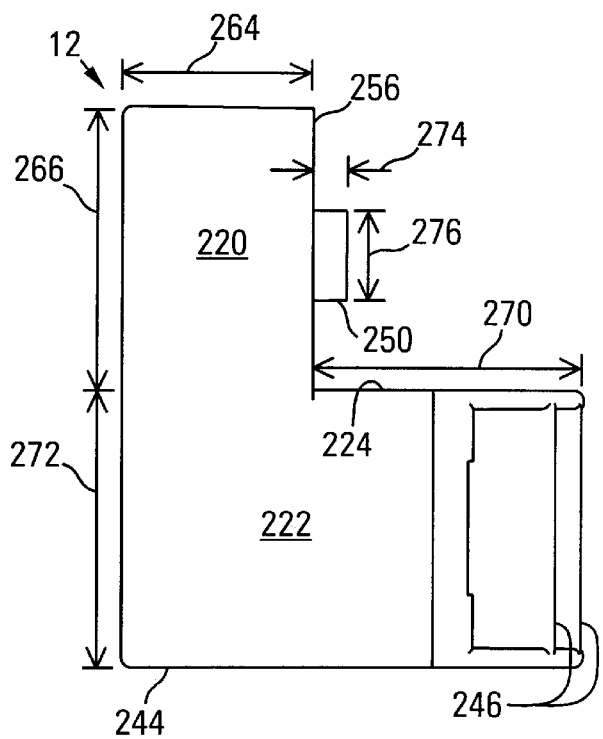
FIG. 13 is a side view of the foot of FIG. 9.

Referring now primarily to FIGS. 3, 4, and 6, with expanded detail views in FIGS. 5, 7, and 8, a standalone chassis cover 10 may include an enclosure 20 comprising a top portion 64 and left and right side portions 66 and 70, respectively. The enclosure 20 is preferably formed of 18 gauge electro-galvanized steel sheet metal. The enclosure 20 may be bent in a press break, and other features such as embosses and screwholes may be punched with a turret press. Alternatively, the enclosure 20 may be formed of any suitable material and may be manufactured with any suitable process, according to the requirements for the chassis and cover.

The top 64 and sides 66 and 70 are preferably arranged at right angles along fold lines 96 and 98. The enclosure 20 preferably has a width 157 of about 489 mm and a length 192 of about 696 mm, with some variation due to the folding over of the sheet metal at the edges to form hems. The enclosure 20 preferably has a height 196 of about 223 mm. The enclosure 20 includes rear portions 112 and 146 which cover small portions of the rear 34 of the chassis 22. The rear portions 112 and 146 of a preferred embodiment have a width 164 (FIG. 5) of about 23 mm, and are formed from portions extending from the sides 66 and 70 which are bent at right angles from the sides 66 and 70. The rear portions 112 and 146 also include mounting tabs 116 and 154 extending from the rear portions 112 and 146 near the base. The mounting tabs 116 and 154 have screwholes 120 and 156, allowing the enclosure 20 to be screwed to the rear 34 of the chassis 22 by screws 80 and 82. This also forms an electrical ground connection, as the metal mounting tabs 116 and 154 contact the metal chassis 22 and are further electrically connected with the screws 80 and 82.

The enclosure 20 also comprises bottom portions 126 and 110, extending from the bottom of the sides 66 and 70 toward the sides 30 and 32 of the chassis 22. The bottom portions 126 and 110 fill a gap between the enclosure sides 66 and 70 and the sides 30 and 32 of the chassis 22 caused by the feet 12, 14, 16, and 18. The bottom portions 126 and 110 included cutout portions (e.g., 200 and 202, FIG. 6) which slide down over and around the feet 12, 14, 16, and 18 during assembly. The cutout portions (e.g., 200 and 202) have a width and depth substantially equal to the width 260 and the depth 264 of the body 220 of a foot 12, as will be described in more detail hereinafter.

The sides 66 and 70 of the enclosure 20 also include screwholes (e.g., 132 and 139) enabling the sides 66 and 70 of the enclosure 20 to be screwed to the feet 12, 14, 16, and 18, which are screwed to the sides 30 and 32 of the chassis 22. The screwholes (e.g., 132 and 139) in the sides 66 and 70 of the enclosure 20 are encircled by small embosses 130, 138, 102, and 104. The embosses 130, 138, 102, and 104 are indentations in the enclosure 20 where the sides 66 and 70 have been pressed in toward the interior of the enclosure. The embosses 130, 138, 102, and 104 allow the heads of the enclosure mounting screws (e.g., 74 and 76) to lie below the surface of the enclosure 20, preventing them from protruding from the enclosure.

The exposed edges of the enclosure 20 are folded over toward the inside to form hem portions (e.g., 134), protecting users from the sharp edges of the sheet metal, and providing a finished appearance. The sides 66 and 70 are folded over at the front 86 of the enclosure to form hem portions 134 and 152. The hem portions 134 and 152 preferably have a width 206 (FIG. 7) of about 17 mm, with the fold preferably having a thickness 190 (FIG. 5) of about 2.5 mm. The top 64 of the enclosure 20 is folded under at the front 86 to form a top front hem portion 142, preferably having a width 204 of about 17 mm and a thickness 160 (FIG. 5) of about 2.5 mm. Small strain relief cutouts (e.g., 100, 101, and 210) may be formed at the corners to prevent bulging as is known in the art. The top 64 of the enclosure 20 is folded under at the rear 90 to form a top rear hem portion 214, preferably having a width 212 of about 5 mm. The rear portions 112 and 146 are folded in to form rear side hem portions 114 and 150, respectively, as best seen in expanded form in FIG. 8, which extend in toward the rear 34 of the chassis 22. The rear side hem portions 114 and 150 preferably have a width 216 of about 11 mm.

The bottom portions 126 and 110 extending from the lower end of the sides 66 and 70 toward the chassis sides 30 and 32 are also folded up to form hem portions, or chassis contact surfaces (e.g., 122, 124, 106). The chassis contact surfaces (e.g., 122, 124, 106) prevent exposure of sharp sheet metal edges, and are preferably as close as possible to the sides 30 and 32 of the chassis. This holds the sides 66 and 70 of the enclosure 20 away from the sides 30 and 32 of the chassis 22 in areas between the feet 12, 14, 16, and 18, which provide the primary support for the enclosure sides 66 and 70.

Referring now primarily to FIGS. 4 and 5, the enclosure 20 of the preferred embodiment may also be provided with spacers 136 and 144, attached to inner surfaces 92 and 94 of the enclosure sides 66 and 70, respectively. The spacers 136 and 144 are preferably formed of the same 18 gauge electro-galvanized steel sheet metal as the enclosure 20. The spacers 136 and 144 may comprise a connection surface (e.g., 172) with an upper arm 174 and a lower arm 180 extending from the connection surface 172 at about 90 degrees to form a 'U' shaped channel. Upper and lower chassis contact surfaces 166 and 184 extend at about 90 degree angles from the upper and lower arms 174 and 180 at the ends opposite the connection surface 172. The spacers 136 and 144 preferably have a height 176 of about 28 mm, a width 164 of about 20 mm, and a length 194 (FIG. 6) of about 575 mm. The upper and lower chassis contact surfaces 166 and 184 preferably have heights 170 and 182, respectively, of about 5.5 mm.

The spacers 136 and 144 are preferably bare sheet metal and extend as far as possible toward the sides 30 and 32 of the chassis 22 while still allowing the enclosure 20 to be slid freely down over the chassis 22 during assembly. The spacers 136 and 144 may contact the chassis sides 30 and 32 to provide an electrical contact between the enclosure 20 and the chassis 22. The spacers 136 and 144 also provide support to the enclosure sides 66 and 70 to hold them away from the chassis sides 30 and 32. This prevents the enclosure sides 66 and 70 from caving in toward the chassis 22 when pressure is applied, and allows the enclosure 20 to fit over the chassis 22 even if it has an irregular shape or protrusions, and ensures that the enclosure 20 is aligned with the chassis bezel 40. The spacers 136 and 144 may be attached to the inner side surfaces 92 and 94 by any suitable means. In a preferred embodiment, the connection surfaces (e.g., 172) of the spacers 136 and 144 are spotwelded to the inner side surfaces 92 and 94 near the top 64 of the enclosure 20, making sure that the spacers 136 and 144 are adjacent the chassis sides 30 and 32. Each spacer 136 and 144 preferably receives at least 6 welds of at least 6 mm diameter on the connection surface (e.g., 172).

The standalone chassis cover 10 may also comprise a plurality of feet 12, 14, 16, and 18, as illustrated in FIGS. 9 through 13. In a preferred embodiment, the standalone chassis cover 10 comprises four feet 12, 14, 16, and 18, attached to the sides 30 and 32 of the chassis 22. Each foot (e.g., 12) comprises a body portion 220 and a base portion 222, wherein the base portion 222 is wider than the body portion 220 to form an "L" shape. The feet 12, 14, 16, and 18 may be formed of any suitable material, such as metal, firm rubber, or plastic. In a preferred embodiment, the feet 12, 14, 16, and 18 are molded of polycarbonate with a small amount of glass fiber added (e.g., about 10% by weight).

The body portion 220 preferably has a height 266 of about 27 mm, a width 260 of about 33 mm, and a depth 264 of about 18 mm. The enclosure sides 66 and 70 are thus held away from the chassis sides 30 and 32 by the depth 264 of the body 220 of the foot 12, thereby avoiding protuberances on the chassis 22 and aligning the enclosure 20 with the bezel 40.

A chassis mount screwhole 232 and an enclosure mount screwhole 236 are formed side by side in the body portion 220, preferably about midway between the top 226 and the base 222 of the foot. The chassis mount screwhole 232, preferably having a diameter 262 of about 5 mm, has a recessed portion 234 allowing a screwhead to rest against a recessed contact surface 230, preventing the screwhead from protruding beyond an enclosure support surface 242 on the body 220, where it would interfere with the enclosure 20. To connect the foot 12 to the chassis 22, a screw (e.g., 56) is screwed through the chassis mount screwhole 232 into a threaded hole 46 in the side 30 of the chassis 22, holding the chassis contact surface 256 against the chassis 22.

A threaded metal insert 240 may be pressed into the enclosure mount screwhole 236, enabling an enclosure connection screw (e.g., 74) to engage in the foot 12 without damaging the glass-filled polycarbonate material. To connect the enclosure 20 to the foot 12, the screw 74 is passed through a screwhole 132 in the enclosure and is screwed into the threaded insert 240 in the foot 12. Thus, the feet 12, 14, 16, and 18 are connected to the chassis 22, and the enclosure 20 is connected to the feet 12, 14, 16, and 18.

The body 220 may also comprise a locating boss 250, a protuberance surrounding the enclosure mount screwhole 236 which engages with a depression (not shown) in the side (e.g., 30 and 32) of the chassis 22. This facilitates placement of the foot 12 during assembly of the standalone chassis cover 10. The locating boss 250 preferably has a diameter 276 of about 8.7 mm and a depth 274 of about 3 mm.

The base 222 is located under the body 220 and preferably has a height 272 of about 27 mm and extends under the chassis 22 a distance 270 of about 26 mm. The chassis 22 is thus vertically supported on the chassis support surface 224, elevating the chassis 22 above a floor or table (not shown) by the height 272 of the base 222. This also protects the bezel 40 if it extends below the chassis 22. The floor or table is protected from being damaged by the chassis 22, since the chassis 22 rests on the base (e.g., 244) of the feet 12, 14, 16, and 18, rather than the metal of the chassis 22. This also aids in moving or lifting the chassis 22, since a gap is provided under the chassis 22 for the mover's fingers or other lifting mechanisms.

The foot 12 may be provided with ribs 246 and 252, reducing the glass-filled polycarbonate material required during molding and reducing weight while preserving strength. The chassis support surface 224 in the base 222 may be formed in a semi-circular arc 254, minimizing the required polycarbonate material.

The outer surfaces of the enclosure 20 are preferably coated to improve the appearance of the standalone chassis cover 10 and to reduce the risk of shock. In a preferred embodiment, the enclosure 20 is powder coated, a process in which a powder is applied to the enclosure 20, then heated until it adheres to the enclosure 20. The inner surfaces of the enclosure 20, particularly the portions which contact the chassis 22, should be protected from the coating to keep the metal bare for a good electrical connection.

The feet 12, 14, 16, and 18 and the enclosure 20 may be connected to the chassis 22 and to each other with any suitable connectors now known or which may be developed in the future. In the presently preferred embodiment, screws (e.g., 56, 74, and 80) are preferably identical, and comprise ten 10–24 torx pan head machine screws.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A cover for a standalone chassis, comprising:
   a plurality of feet, each of said plurality of feet comprising a base portion and a body portion, said body portion comprising a chassis mounting hole and an enclosure mounting hole;
   said plurality of feet attached to said standalone chassis at said chassis mounting holes, said base portions extending below a bottom surface of said standalone chassis to provide vertical support for said standalone chassis; and
   an enclosure attached to said plurality of feet at said enclosure mounting holes to cover a portion of said standalone chassis.

2. The cover of claim 1, wherein said enclosure comprises a metal radio-frequency interference shield.

3. The cover of claim 2, wherein an exterior surface of said enclosure is coated and at least a portion of an inner surface is uncoated to allow an electrical contact between said metal radio-frequency interference shield and said standalone chassis.

4. The cover of claim 1, wherein said enclosure comprises a top portion and two side portions for covering a top and two sides of said standalone chassis and exposing a front, a rear and a bottom of said standalone chassis.

5. The cover of claim 1, wherein said enclosure is made of sheet metal.

6. The cover of claim 1, wherein said plurality of feet comprises four feet.

7. The cover of claim 1, wherein said at least one of said plurality of feet further comprises a locating boss extending from an inner surface of said body portion for engaging with a recess in said standalone chassis.

8. The cover of claim 1, wherein said enclosure mounting hole is threaded so that said enclosure may be attached to said at least one of said plurality of feet with a screw.

9. The cover of claim 9, wherein said threaded enclosure mounting hole comprises a metal threaded insert.

10. The cover of claim 1, wherein said plurality of feet are made primarily of polycarbonate.

11. The cover of claim 1, further comprising at least one spacer attached to an inner surface of said enclosure to separate said enclosure from said standalone chassis.

12. The cover of claim 11, wherein said at least one spacer comprises:

an enclosure mounting surface attached to said inner surface of said enclosure;

an extension member connected to said enclosure mounting surface; and a chassis contact surface connected to said extension member.

13. The cover of claim 12, wherein said enclosure mounting surface is spot-welded to said inner surface of said enclosure.

14. The cover of claim 12, wherein said at least one spacer is formed of sheet metal, and wherein said chassis contact surface conducts electricity between said standalone chassis and said at least one spacer, and said enclosure mounting surface conducts electricity between said at least one spacer and said enclosure.

15. The cover of claim 1, wherein said enclosure comprises a plurality of mounting holes adjacent said plurality of feet so that said enclosure may be screwed to said plurality of feet through said plurality of mounting holes.

16. The cover of claim 15, wherein said enclosure further comprises an embossed area around each of said plurality of mounting holes so that a head of a mounting screw attaching said enclosure to one of said plurality of feet does not extend above a surface of said enclosure.

17. A method of covering a standalone chassis, comprising:

providing a plurality of feet each comprising a base portion and a body portion, said body portion comprising a chassis mounting hole and an enclosure mounting hole;

attaching said body portions of said plurality of feet to at least two side portions of said standalone chassis using said chassis mounting holes so that said base portions extend below a lower surface of said standalone chassis to provide vertical support to said standalone chassis;

providing an enclosure comprising a top portion and at least two side portions; and attaching said at least two side portions of said enclosure to said plurality of feet using said enclosure mounting holes on said body portions so that said top portion of said enclosure substantially covers a top of said standalone chassis and said at least two side portions of said enclosure substantially cover said at least two chassis side portions.

18. A kit for covering a standalone chassis, comprising:

four feet, each comprising a body portion and a base portion in an 'L' shape, said body portion having a threaded enclosure mounting hole and a chassis mounting hole so that said body portions of said four feet may be screwed to said sides of a standalone chassis through said chassis mounting hole and said base portions extend below a bottom surface of said standalone chassis; and an enclosure having a top portion and two side portions, said two side portions each having two embossed mounting holes to enable the enclosure to be screwed to said threaded enclosure mounting holes of said four feet.

19. The kit of claim 18, further comprising a spacer attached to an inner surface of said enclosure.

* * * * *

UNITED STATES PATENT AND TRADEMARK OFFICE
CERTIFICATE OF CORRECTION

PATENT NO.     : 6,255,583 B1                                     Page 1 of 1
DATED          : July 3, 2001
INVENTOR(S)    : Kristianne E. Johnson et al.

It is certified that error appears in the above-identified patent and that said Letters Patent is hereby corrected as shown below:

<u>Column 9,</u>
Line 1, delete "claim 9" and insert therefor -- claim 8 --

Signed and Sealed this

Third Day of December, 2002

JAMES E. ROGAN
*Director of the United States Patent and Trademark Office*